United States Patent
Rich et al.

(10) Patent No.: US 7,146,587 B2
(45) Date of Patent: Dec. 5, 2006

(54) SCALABLE LOGIC SELF-TEST CONFIGURATION FOR MULTIPLE CHIPS

(75) Inventors: Marvin J. Rich, Poughkeepsie, NY (US); Jay R. Herring, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 312 days.

(21) Appl. No.: 10/753,852

(22) Filed: Jan. 8, 2004

(65) Prior Publication Data

US 2005/0155003 A1    Jul. 14, 2005

(51) Int. Cl.
    *G06F 17/50* (2006.01)
(52) U.S. Cl. .............................. 716/4; 716/5
(58) Field of Classification Search ............... 716/4–6; 714/700, 733, 707, 718, 742, 744
    See application file for complete search history.

(56) References Cited

U.S. PATENT DOCUMENTS

| | | | |
|---|---|---|---|
| 5,349,587 A | 9/1994 | Nadeau-Dostie et al. | 371/22.3 |
| 5,648,959 A * | 7/1997 | Ilyadis et al. | 370/445 |
| 5,680,543 A | 10/1997 | Bhawmik | 395/183.06 |
| 5,900,753 A | 5/1999 | Cote et al. | 327/145 |
| 5,909,451 A | 6/1999 | Lach et al. | 371/22.31 |
| 6,106,568 A * | 8/2000 | Beausang et al. | 716/18 |
| 6,115,827 A | 9/2000 | Nadeau-Dostie et al. | 713/503 |
| 6,163,545 A | 12/2000 | Flood et al. | 370/465 |
| 6,247,082 B1 | 6/2001 | Lo et al. | 710/105 |
| 6,327,684 B1 | 12/2001 | Nadeau-Dostie et al. | 714/731 |
| 6,327,685 B1 | 12/2001 | Koprowski et al. | 714/733 |
| 6,434,733 B1 | 8/2002 | Duggirala et al. | 716/11 |
| 6,442,722 B1 | 8/2002 | Nadeau-Dostie et al. | 714/731 |
| 6,467,044 B1 | 10/2002 | Lackey | 713/501 |
| 6,614,263 B1 * | 9/2003 | Nadeau-Dostie et al. | 326/93 |
| 2005/0257109 A1 * | 11/2005 | Averbuj et al. | 714/733 |

FOREIGN PATENT DOCUMENTS

EP    WO 02/077656 A1    3/2002

OTHER PUBLICATIONS

Schmid, et al., "Advanced Synchronous Scan Test Methodology for Multi Clock Domain ASICs", Proceedings 17th, IEEE VLSI Test Symposium, pp. 106-113, 1999.

IBM Technical Disclosure Bulletin, "Method and Apparatus for Handling Multiple Clock Domain at Speed Logic Built-in Self-Test within a Single Logic Built-in Self-Test Structure", vol. 38, No. 11, Nov. 1995, pp. 499-500.

* cited by examiner

*Primary Examiner*—Vuthe Siek
(74) *Attorney, Agent, or Firm*—John E. Campbell; Jill M. Breedlove, Esq.; Heslin Rothenberg Farley & Mesiti P.C.

(57) ABSTRACT

A scalable LBIST control structure provides for testing of multiple independent clock domains within a chip and/or across multiple chips. The LBIST control structure sequences all clock domains through each step of the LBIST sequence synchronously, allowing multiple clock domains and/or multiple chips to be controlled from a common point.

20 Claims, 8 Drawing Sheets

COMMAND TRANSFER BLOCK OPERATION

| CURRENT STATE | TOP IN | BOT IN | NEXT STATE | TOP OUT | BOT OUT |
|---|---|---|---|---|---|
| Cmd Inactive | 0 | X | Cmd Inactive | 0 | 0 |
| Cmd Inactive | 1 | X | Cmd Active | 1 | 1 |
| Cmd Start | 0 | 0 | Cmd Start | 1 | 0 |
| Cmd Start | 0 | 1 | Cmd Active | 0 | 0 |
| Cmd Start | 1 | X | Cmd Active | 1 | 1 |
| Cmd Active | 0 | 0 | Cmd Inactive | 0 | 0 |
| Cmd Active | 0 | 1 | Cmd Active | 1 | 0 |
| Cmd Active | 1 | X | Cmd Active | 1 | 1 |

*fig. 5*

OPCG OPERATION

| CURRENT STATE | IN | COMPLETE | NEXT STATE | OUT |
|---|---|---|---|---|
| SCAN ACTIVE | X | 0 | SCAN ACTIVE | 1 |
| SCAN ACTIVE | 0 | 1 | SCAN CMPLT | 0 |
| SCAN ACTIVE | 1 | 1 | SCAN ACTIVE | 1 |
| SCAN CMPLT | 0 | X | SCAN CMPLT | 0 |
| SCAN CMPLT | 1 | X | S-CLK ACTIVE | 1 |
| S-CLK ACTIVE | X | 0 | S-CLK ACTIVE | 1 |
| S-CLK ACTIVE | 0 | 1 | S-CLK CMPLT | 0 |
| S-CLK ACTIVE | 1 | 1 | S-CLK CMPLT | 1 |
| S-CLK CMPLT | 0 | X | S-CLK CMPLT | 0 |
| S-CLK CMPLT | 1 | X | SCAN ACTIVE | 1 |

*fig. 6*

SCALABLE LOGIC SELF-TEST CONFIGURATION FOR MULTIPLE CHIPS

CROSS REFERENCE TO RELATED APPLICATION

This application contains subject matter which is related to the subject matter of the following application, which is assigned to the same assignee as this application and which is hereby incorporated herein by reference in its entirety:

"Simultaneous AC Logic Self-Test of Multiple Clock Domains," Rich et al., Ser. No. 10/753,801, filed Jan. 8, 2004.

TECHNICAL FIELD

This invention relates generally to testing integrated circuit chips, and, more particularly, to a scalable configuration for logic self-testing of multiple clock domains and/or multiple chips.

BACKGROUND OF THE INVENTION

Integrated circuit (IC) chips are becoming increasingly complex, such that Systems on a Chip (SoC's) are becoming more commonplace. SoC's comprise multiple independently designed logic functions combined on a single chip to perform complex operations. The independently developed logic circuits each have an independently designed clock domain, the frequency thereof being optimized to meet particular performance criteria. Each circuit is designed as a general macro without a priori knowledge of final chip packaging, which presents a challenge for logic built-in self-testing (LBIST) of the IC package. Currently, LBIST for such SoC's involves independent testing of each clock domain, requiring detailed a priori knowledge of the clock domain frequency requirements as well as additional test design overhead to achieve desired results. An even further challenge is presented by logic self-testing of multiple chips on a card.

Accordingly, it is desirable to provide a robust logic built-in self-test (LBIST) structure that applies to an aggregation of independently developed circuits, without requiring a priori knowledge of independent clock domain requirements. It is further desirable that such a LBIST structure be applicable to testing multiple chips in a system, without sacrificing repeatable chip signatures.

SUMMARY OF THE INVENTION

The shortcomings of the prior art are overcome and additional advantages are provided through a scalable logic self-test control configuration that provides for synchronous testing of multiple independent clock domains within a chip and/or across multiple chips.

In accordance with an aspect of the present invention, a command transfer control hierarchy comprises a plurality of control levels, including a first level comprising a master command transfer control, and including at least one additional lower level, each lower level having a plurality of command transfer controls configured serially, each command transfer control of a last level being associated with at least one of the clock domains. A communication protocol provides for communicating commands among the control levels, such that command activation signals are immediately propagated serially from the first level to lower levels, and serially across command transfer controls in each level; and further such that command deactivation signals are communicated serially among and across control levels upon receipt of feedback from all lower levels that a commanded operation has been completed.

Systems and computer program products corresponding to the above-summarized methods are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5 is a table illustrating operation of a command transfer block such as that illustrated in FIG. 3;

FIG. 6 is a table illustrating operation of an exemplary OPCG such as utilized in FIG. 3;

BEST MODE FOR CARRYING OUT THE INVENTION

Presented herein is a technique for configuring a scalable, hierarchical test structure for synchronous self-testing of multiple independently developed clock domains on a single IC chip or across multiple IC chips on a card. The technique is described herein specifically with reference to an LBIST (logic built-in self-test) structure, but may be applied to other IC testing structures, as will be appreciated by those of ordinary skill in the art.

Figure 1:
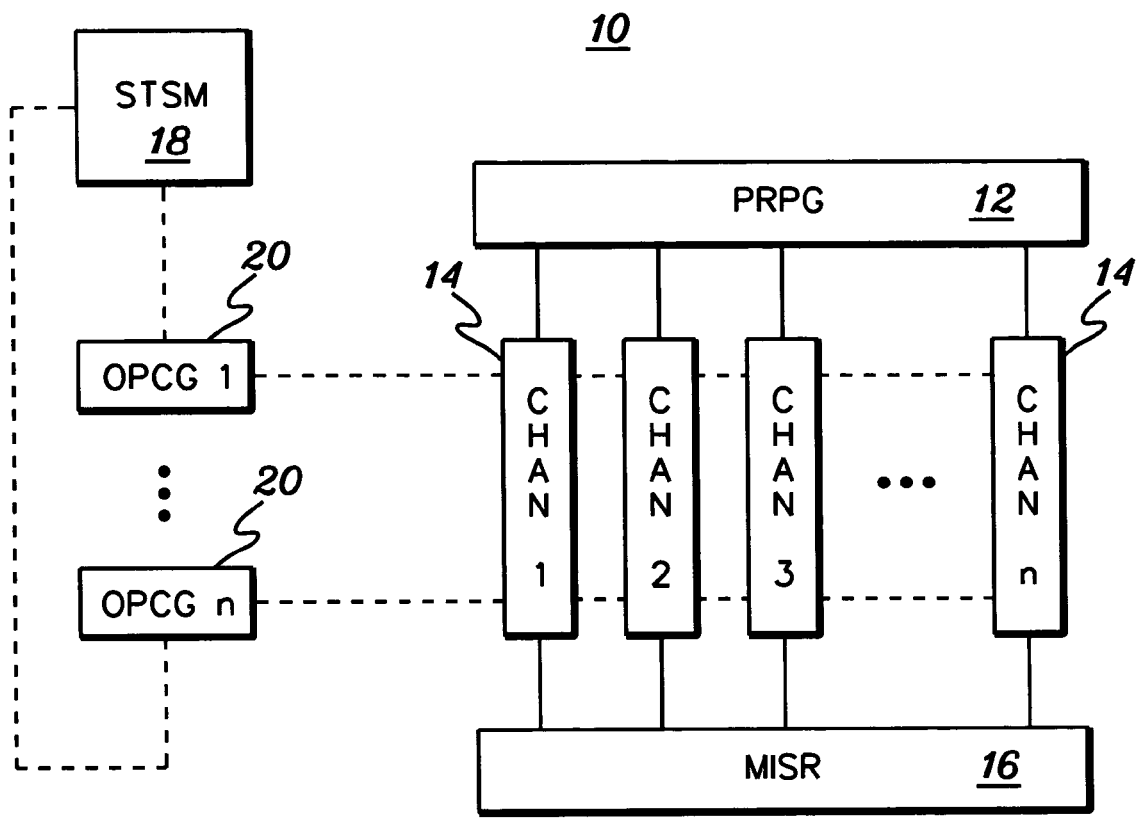
FIG. 1 is a block diagram illustrating a typical LBIST configuration.

FIG. 1 is a block diagram of a typical LBIST system 10. A pseudo random pattern generator (PRPG) 12 comprises linear feedback shift registers for generating random patterns to feed latches configured as multiple scan channels 14. The output from each scan channel 14 provides a bit in a multiple input signature (MISR) register 16. MISR 16 comprises linear feedback shift registers for ensuring that a unique bit pattern signature is compressed into the MISR at the completion of an LBIST sequence. An LBIST sequence comprises multiple LBIST cycles; and an LBIST cycle comprises a full scan load of all channels, followed by a functional system clock. Each subsequent scan load also simultaneously compresses a running signature into the MISR. The LBIST sequence is controlled by a Self-Test State Machine 18, which provides control signals to each OPCG(1–n) 20. Once an LBIST sequence is completed, MISR 16 will have a signature value that only matches a "good chip" signature, i.e., the signature of a properly functioning chip, if the chip under test also matches the good chip behavior. The system clock generated during LBIST by the OPCG has the same frequency as that generated by the OPCG during normal operation, thereby ensuring proper operation at machine speed.

In accordance with U.S. patent application Ser. No. 10/753,801, entitled "Simultaneous AC Logic Self-Test of Multiple Clock Domains," filed concurrently herewith and assigned to the instant assignee, a technique is provided for simultaneous logic self-testing, e.g., LBIST, of internal logic and asynchronous boundary requirements of an IC having a plurality of clock domains. (A particular clock domain refers to a specified oscillator and a specified frequency.) The self-testing may be selectively performed on internal logic or asynchronous boundaries, or any combination thereof, of selectively chosen clock domains, or any combination thereof. U.S. patent application Ser. No. 10/753,801, entitled "Simultaneous AC Logic Self-Test of Multiple Clock Domains" is incorporated by reference in its entirety.

Figure 2:
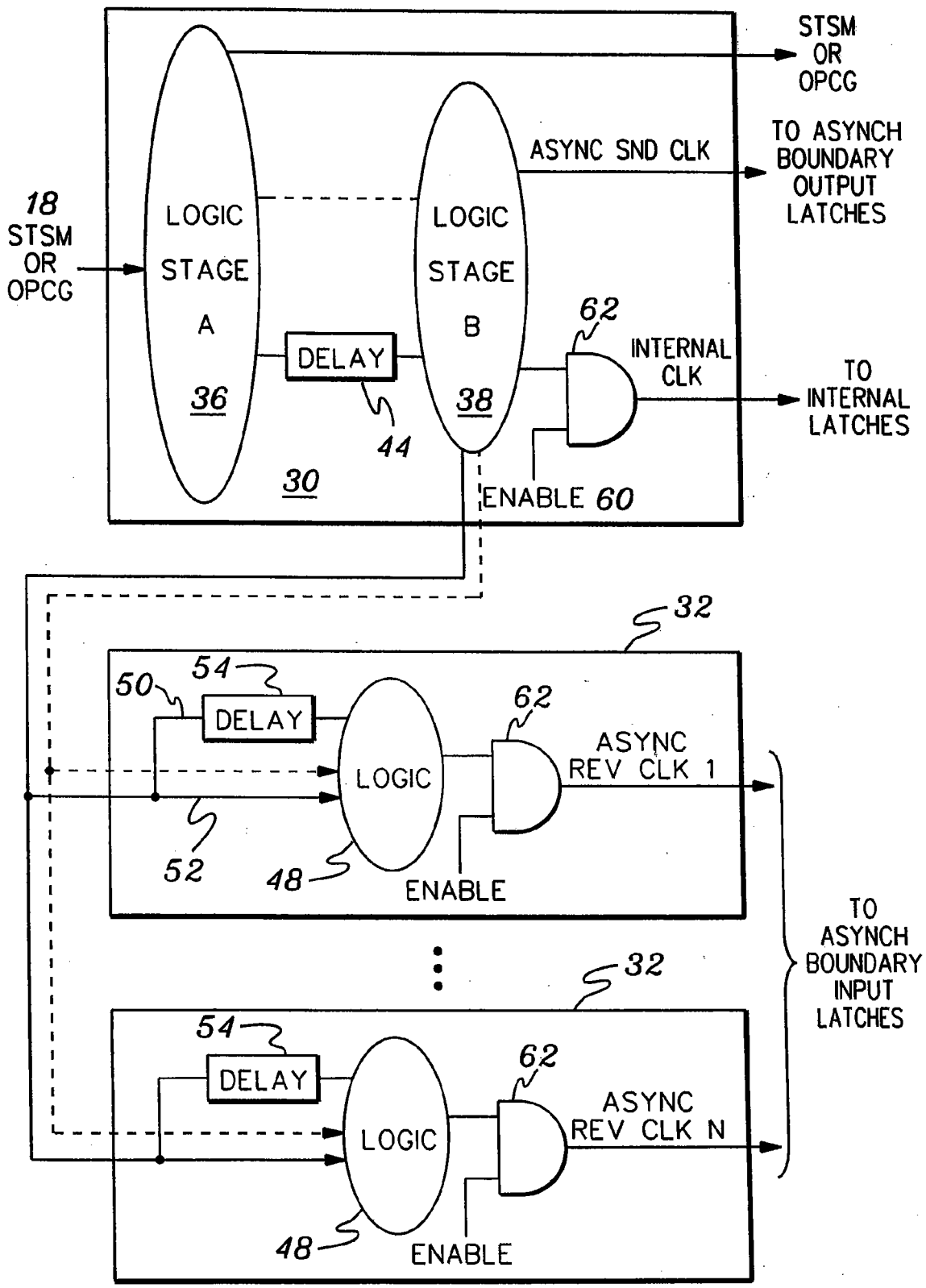
FIG. 2 depicts an OPCG configuration in support of internal and asynchronous boundary logic for an exemplary clock domain having N asynchronous boundary interfaces in accordance with an exemplary embodiment of U.S. patent application Ser. No. 10/753,801, entitled "Simultaneous AC Logic Self-Test of Multiple Clock Domains"

FIG. 2 illustrates an exemplary on product clock generation (OPCG) logic core structure 30 interfacing with N clock domains in accordance with U.S. patent application Ser. No. 10/753,801, entitled "Simultaneous AC Logic Self-Test of Multiple Clock Domains," cited hereinabove. OPCG 30 receives commands from self-test state machine (STSM) 18, or another serially connected OPCG, and provides to asynchronous receive clock drivers 32 a functional clock sequence during normal operation, and a scan clock sequence or capture clock during LBIST testing operation. In the illustrated structure of FIG. 2, each respective first through Nth clock domain has a respective asynchronous receive clock driver 32 associated therewith. In FIG. 2, data lines are represented as solid lines; and control lines are represented as dotted lines.

OPCG 30 is illustrated in FIG. 2 as comprising a first logic stage (Logic Stage A) 36, which generates an appropriate clock sequence, i.e., a test or functional clock sequence, in response to the command and mode of operation from STSM 18 (or other OPCG). During the normal mode of operation, there are no state transitions in the OPCG configuration, and only normal functional clocks are generated by logic stage 36 until STSM 18 signals a change in mode of operation, e.g., to LBIST mode. In LBIST mode, logic stage 36 generates scan clock sequences along with a single functional clock sequence. In particular, an exemplary LBIST iteration, or cycle, begins in the LBIST scan state, wherein scan clocks are generated. Upon completion of scanning operations, the cycle switches to the LBIST system clock state, wherein system clocks are generated in accordance with exemplary embodiments of the present invention to test simultaneously and/or selectively the internal logic and asynchronous boundaries. The next LBIST iteration then begins by switching back to the LBIST scan state. The STSM determines the number of LBIST iterations, or cycles, to perform, before switching back to the normal mode of operation.

OPCG core 30 is illustrated in FIG. 2 as comprising a second logic stage (Logic Stage B) 38 for determining the type of clock sequence to send to the asynchronous receive clock drivers 32, and for forwarding the respective clock sequences to driver logic 48. In particular, logic stage 38 distributes the clock signals from Logic Stage A, depending on the mode of operation. In LBIST system clock mode, logic stage 38 blocks the launch clocks to the asynchronous receiver clocks. As illustrated in FIG. 2, all clock signals may comprise a delay 44 for synchronizing OPCG clock commands among multiple OPCG's that are serially connected during an LBIST operation.

In one embodiment, the first logic stage 36 generates multiple scan clocks, as defined by a programmable counter (not shown), such that STSM 18 initiates the scan sequence for LBIST operation with one command, as an alternative to individual scan clock commands from the STSM.

For each asynchronous boundary, a common asynchronous boundary receive clock driver 32 is connected to OPCG 30. The control signal from OPCG logic stage 38 selects path 50 with delay 54 only during an LBIST system clock state, and path 52 (i.e., without a delay) otherwise. That is, in the LBIST system clock state of the LBIST mode of operation, the clock driver 32 is subject to programmable delay 54, such that the capture of signals at the asynchronous boundary receiver latches (not shown) will be subject thereto. In an LBIST scan state, the control signal from logic stage 38 selects path 52. And during the normal mode of operation, asynchronous boundary receive clock driver 32 generates the normal operational clock sequence on path 52.

As illustrated in FIG. 2, enable signals 60 may be provided via logic 62 (e.g., AND gates) in the OPCG and asynchronous boundary receive clock drivers in order to allow for selective testing on internal logic or asynchronous boundaries, or any combination thereof. For example, selective logic self-testing may be performed in the following exemplary combinations: internal logic and asynchronous boundaries of a single clock domain on an IC; internal logic and asynchronous boundaries of multiple clock domains, each of which may be operating at a different frequency; internal logic and asynchronous boundaries of multiple clock domains, each of which may be running from an independent oscillator, i.e., having no phase alignment requirements; asynchronous boundaries of multiple asynchronous interfaces within a single clock domain; asynchronous boundary requirements of multiple clock domains, any of which may have multiple asynchronous interfaces; internal logic only of multiple clock domains; and so on.

In accordance with one aspect of the present invention, a scalable, hierarchical configuration is provided for synchronous logic self-testing of multiple clock domains within a single chip or across multiple chips.

Figure 3:
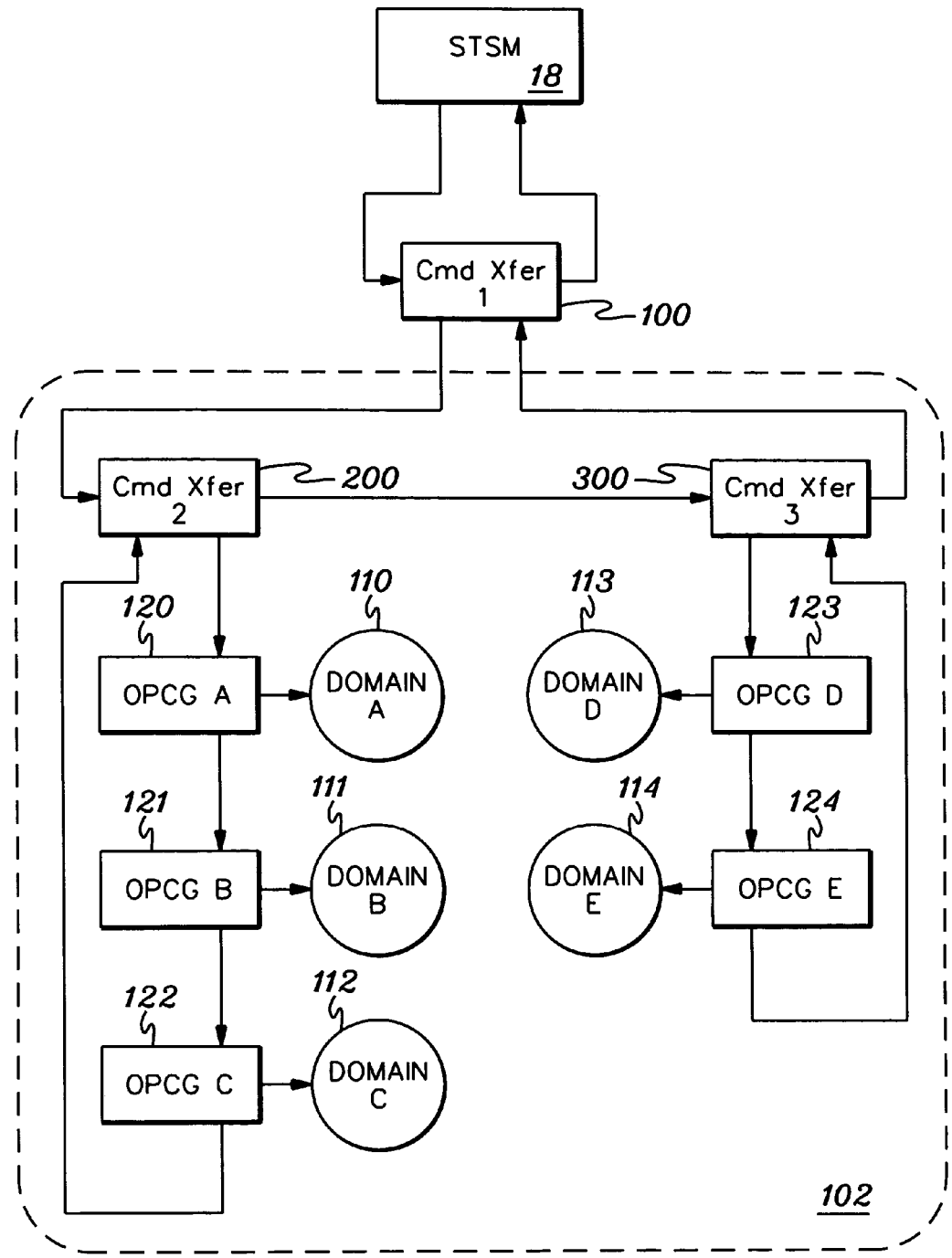
FIG. 3 depicts an exemplary hierarchical configuration of a system in accordance with an aspect of the present invention utilizing a single chip comprising multiple independently developed clock domains.

FIG. 3 illustrates an exemplary control configuration comprising a hierarchy of command transfer blocks 100, 200 and 300 in accordance with an aspect of the present invention for synchronous self-testing of multiple clock domains on a single chip 102. By way of example only, command transfer block 200 is illustrated as controlling commands to three clock domains 110–112, each clock domain 110–112 respectively being associated with a separate OPCG 120–122, respectively; and command transfer block 300 is illustrated as controlling commands to two clock domains 113–114, each clock domain 113–114 respectively being associated with a separate OPCG 123–124, respectively. Exemplary OPCG's 120–124 comprise structures, such as illustrated in FIG. 2 and described hereinabove, for testing multiple clock domains and asynchronous boundaries in accordance with U.S. patent application Ser.

No. 10/753,801, entitled "Simultaneous AC Logic Self-Test of Multiple Clock Domain," cited hereinabove.

Figure 7:
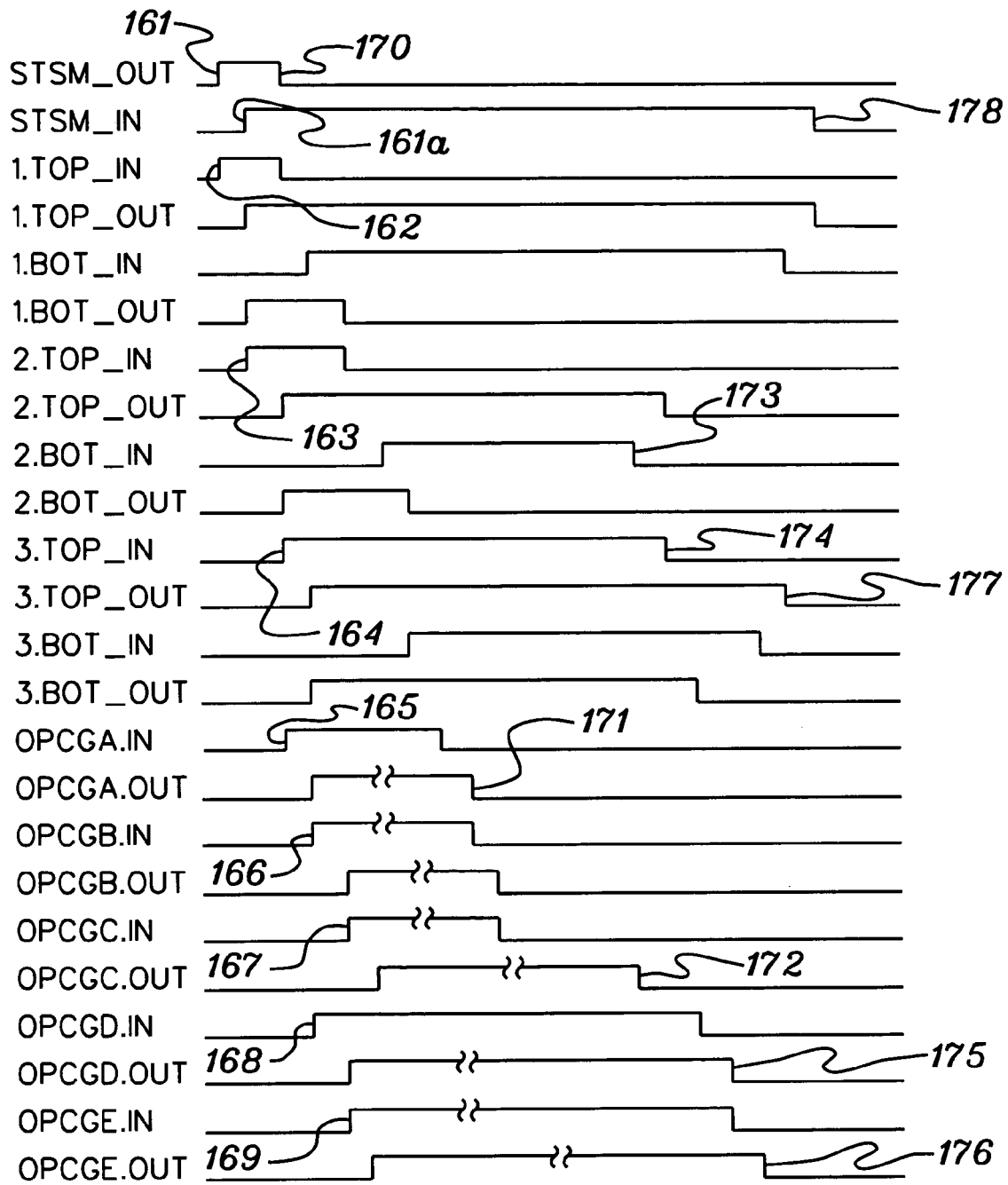
FIG. 7 is a timing diagram illustrating operation of the configuration of FIG. 3.

In accordance with an aspect of the present invention, command transfer blocks are utilized to implement a hierarchical control structure. In the exemplary single-chip configuration of FIG. 3, the first level command transfer block 100 communicates with STSM 18; and, in turn, the first level command transfer block 100 communicates with the second level command transfer blocks 200 and 300. In a multiple-chip control structure, such as illustrated in FIG. 7 and described in more detail hereinbelow, additional levels of command transfer are provided such that a command transfer block controlling one chip is coupled to a command transfer block controlling another chip, allowing multiple chips to proceed through an LBIST sequence synchronously.

In accordance with another aspect of the present invention, the command transfer blocks that implement the hierarchical control communicate with the STSM using a single-wire protocol. The single-wire, or STSM, protocol sequences all clock domains and/or chips through their LBIST cycles via a global synchronization signal. Each chip comprises one or more satellite command transfer blocks coupled to either an OPCG or another command transfer block. In particular, command transfer blocks communicate with OPCG's for locally controlling the LBIST sequence; and command transfer blocks communicate with peer command transfer blocks, i.e., on the same level, for globally propagating the LBIST synchronization signal. The STSM protocol synchronizes LBIST execution across multiple participating clock domains or chips, and also determines when all chips have completed LBIST operation.

A master STSM 18 communicates with the topmost command transfer block in the hierarchy (i.e, at the highest level) by activating and deactivating the global synchronization signal. The response of each command transfer block to the activation or deactivation of the global synchronization signal depends on the state thereof. Activation signals, i.e., signals used to start operations, are immediately forwarded to both command transfer block output ports, as described in more detail hereinbelow. On the other hand, deactivation signals are not forwarded until the completion of a previously activated operation. In this way, the master STSM advantageously gets feedback that all operations were started as quickly as possible. The deactivation signal is not seen by the master STSM until all chips in the chain, or hierarchy, have completed the requested operation, as reflected by the state of the command transfer blocks. Upon receipt of the deactivation signal, the master STSM can initiate a new request by activating the global synchronization signal, since all chips are at the synchronization point. The STSM merely repeats each LBIST cycle for the number of iterations required to properly LBIST all chips in the configuration. The iteration count is specified in a programmable register, for example. (An LBIST cycle comprises a scan channel load sequence followed by a system clock sequence.)

Figure 4:
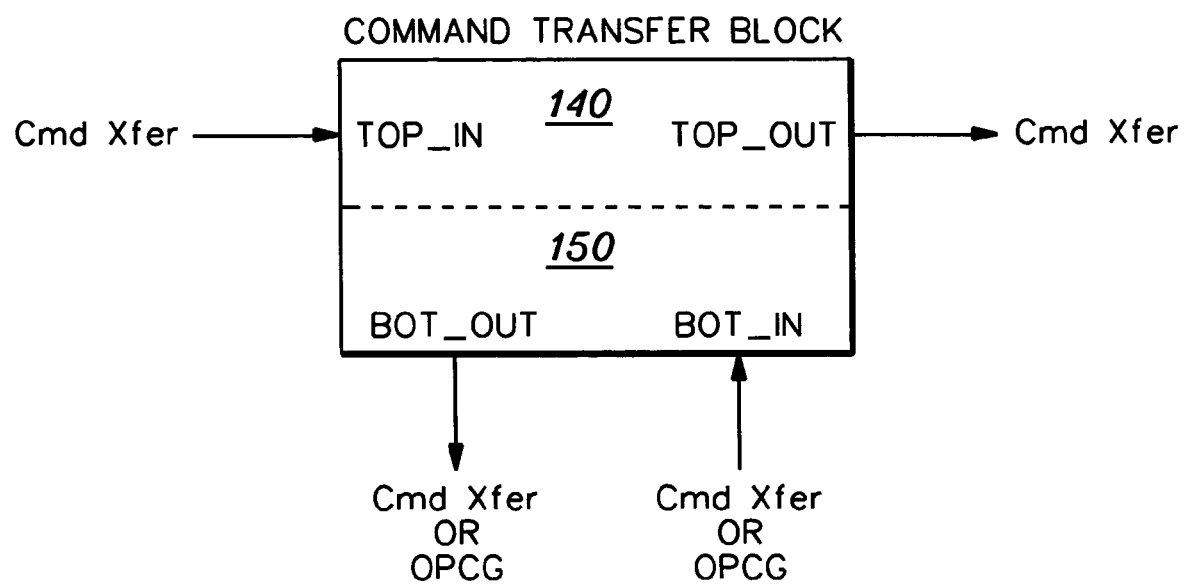
FIG. 4 is a block diagram illustrating details of an exemplary command transfer block such as that utilized in FIG. 3.

FIG. 4 illustrates a command transfer block structure in accordance with exemplary embodiments of the present invention. The embodiment of FIG. 4 is illustrated as having a first section 140, shown as the "top" section, and a second section 150, shown as the "bottom" section. (Use of the terms top and bottom are for ease of explanation only and do not signify order or structure.) The function of the top section is to propagate commands quickly across a scalable hierarchy. The functions of the bottom section are to propagate commands down toward the OPCG's, where the command is executed, and to synchronize the completion of commands. The protocol is implemented such that command start events (i.e., global synchronization signal activated) are quickly forwarded to initiate global execution of the command. Synchronization is achieved by not forwarding command completion events (i.e., global synchronization signal deactivated) to other command transfer blocks at the same level until all lower level command transfer blocks have signaled acceptance of the previous command activation signal (i.e., represented as BOT_IN=1), and have subsequently signaled completion of the command (i.e., represented as BOT_IN=0). Completion events are immediately forwarded to command transfer blocks at lower levels (i.e., represented as BOT_OUT=0) in order to put the first OPCG in a state to immediately forward its completion event to the next OPCG upon completion of the command. FIG. 5 is a table illustrating operation of a command transfer block in accordance with exemplary embodiments of the present invention.

The activation or deactivation of a single global synchronization signal by the master STSM will eventually propagate to the OPCG's. This will cause a specified operation to occur in the OPCG's, depending on their current state. FIG. 6 is a table illustrating operation of an OPCG in accordance with exemplary embodiments of the present invention. The OPCG protocol is as follows. The system clock complete state is the initial state of the OPCG's. The global synchronization signal is activated by the master STSM to start the scan phase of an LBIST cycle via the transition to the scan active state. Each OPCG immediately forwards the activation signal to the next OPCG in sequence, thereby activating the scan active state downstream.

In the scan active state, the satellite STSM initiates an LBIST channel load sequence, wherein the scan channels are initialized with random data. Data is simultaneously compressed into the signature register (see MISR 16 of FIG. 1). Upon completion of the channel load sequence, the OPCG remains in this state until a deactivated global synchronous signal is detected. Once a deactivated value is detected, the deactivated global synchronization signal value is forwarded to the next OPCG, and this OPCG enters the scan complete state.

In the scan complete state, the global synchronization signal is activated by the master STSM to start the system clock active state of an LBIST cycle. The OPCG will immediately forward the activated global synchronization signal upon receipt to the next OPCG in sequence, and then enter the system clock active state.

In the system clock active state, the OPCG initiates an LBIST system clock sequence, wherein the system clock(s) are activated to affect a state change in the internal logic. Upon completion of the system clock sequence, the OPCG remains in this state until a deactivated global synchronization signal is detected. Once a deactivated value is detected, the deactivated global synchronization value is forwarded to the next OPCG, and this OPCG enters the system clock complete state.

FIG. 7 is a timing diagram illustrating an exemplary single-chip LBIST control hierarchy for a single-chip structure, such as that of FIG. 3, in accordance with an aspect of the present invention. The STSM activates a command 161 that is quickly propagated through the command transfer block hierarchy per signals 162–164 to the OPCG's. The OPCG's quickly forward the command to the serially connected OPCG's (i.e., OPCGA, B, C signal chain 165–167 and OPCGD, E signal chain 168–169). The master STSM launches a synchronization event completion signal 170 immediately upon seeing acknowledgement 161A of the activation event during the previous cycle. This propagates downward to the first OPCG chain (i.e., associated with command transfer block 200) to enable the propagation of command completion status. A command completion signal is not forwarded until all lower level OPCG's have completed the commanded operation. OPCGA completes the commanded operation and forwards completion signal 171 to OPCGB; and OPCGC is the last in the chain to complete operation as indicated by signal 172. In particular, a completion status signal is not forwarded until the current OPCG has completed the operation; or, alternatively, is immediately forwarded if the current OPCG has already completed its command upon receipt of the completion event from the previous OPCG. Once all OPCG's have completed the commanded operation and have forwarded the completion event signal, the completion event will be seen at command transfer block 173 (2.BOT_IN). At this point, the commanded operation has been completed for all lower levels for that command transfer block, and the completion event signal is transferred to the next command transfer block at the same level per signal 174 (3.TOP_IN). This initiates a completion synchronization sequence in the second string of OPCG's (i.e., associated with command transfer block 300) per signals 175 and 176, which will eventually be forwarded by the associated command transfer block per signal 177 (3.TOP.OUT), thus propagating the completed operation status up the hierarchy to the master STSM 18. The deactivation at 178 comprises acknowledgement to the master STSM deactivation at 170, indicating that the commanded operation has been completed across all clock domains. Subsequently, the master STSM can initiate another command by raising STSM_OUT 161 again.

Figure 8:
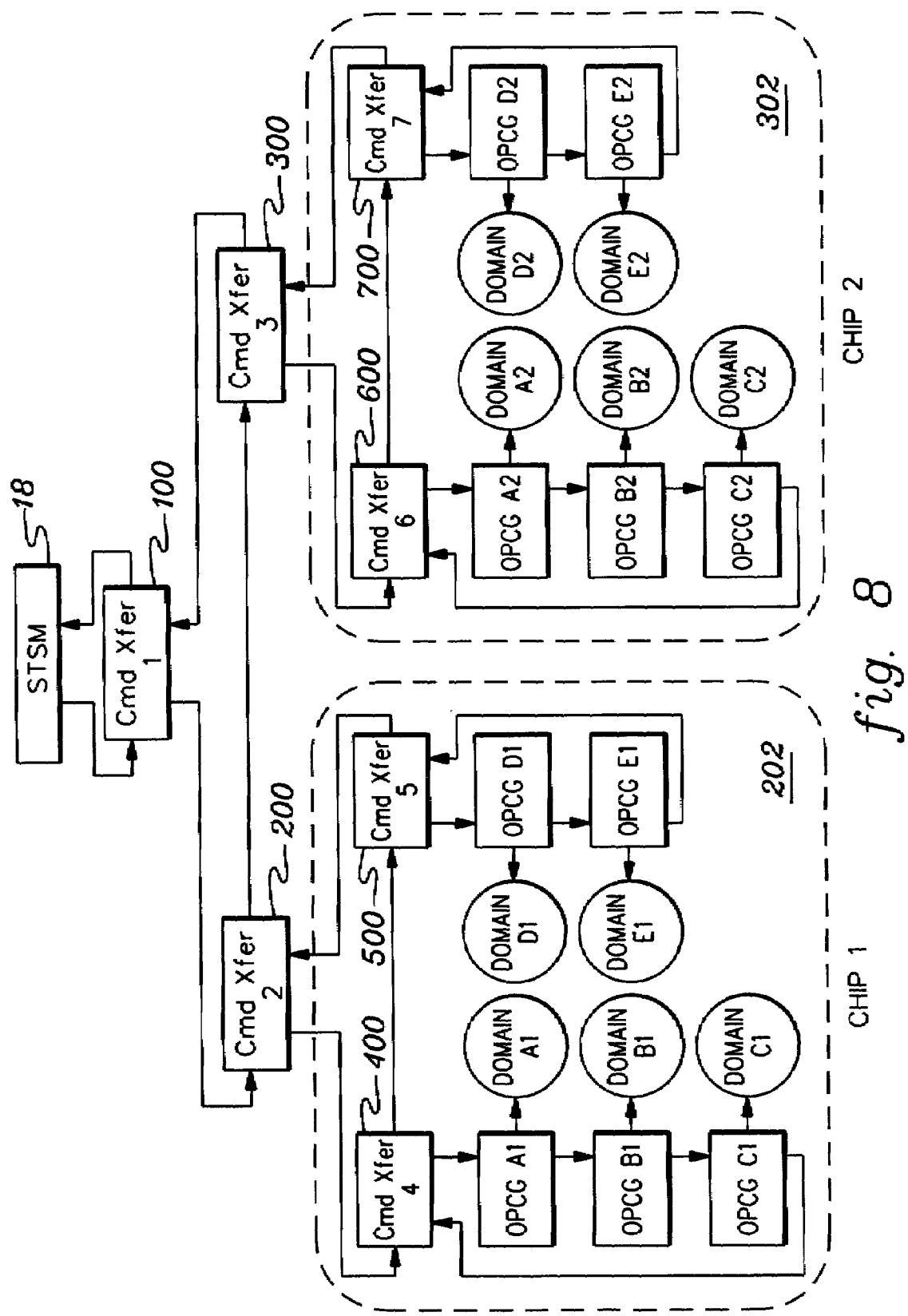
FIG. 8 depicts an exemplary hierarchical configuration of a system in accordance with an aspect of the present invention utilizing multiple IC chips, each comprising independently developed clock domains.

FIG. 8 illustrates an exemplary scalable, hierarchical configuration for logic self-testing of a multi-chip system, each having independently developed clock domains, in accordance with an aspect of the present invention. For purposes of illustration only, FIG. 8 illustrates a system having two chips 202 and 302, each having a structure similar to chip 102 illustrated in FIG. 3. Those of ordinary skill in the art will appreciate that this particular chip structure is exemplary only for purposes of illustration and does not limit the scope of the invention.

FIG. 8 further illustrates the scalable, hierarchical control configuration in accordance with an aspect of the present invention. In particular, in the illustrated two-chip system, two levels of command transfer have been added comprising command transfer blocks 100, 200, 300; with the first level of command transfer comprising command transfer block 100, the second level of command transfer comprising command transfer blocks 200 and 300, and the third level comprising existing internal chip command transfer blocks 400, 500, 600 and 700. According to the protocol described hereinabove, command start events are immediately forwarded to each command transfer block, in turn, on the same level to initiate global execution of the command. However, synchronization is achieved by not forwarding command completion events to the other command transfer blocks in sequence at the same level until all lower level command transfer blocks have signaled completion of the command, (i.e., BOT_IN=1 followed by BOT_IN=0). For example, in FIG. 7, until command transfer block 400 gets feedback from the control chain comprising OPCG A1, OPCGB1 and OPCGC1 that the commanded sequence has been completed, then the completion event will not be forwarded to command transfer block 500. In like manner, the command will not be forwarded from command transfer block 200 to command transfer block 300 until command transfer block 200 gets feedback that the commanded operation has been completed by both command chains comprising blocks 400 and 500. In this way, synchronization of LBIST testing of multiple chips having independently developed clock domains is advantageously achieved on a scalable basis, without requiring a priori knowledge of the independent clock domain requirements.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A system for testing integrated circuitry comprising a plurality of clock domains and at least one integrated circuit chip, the system comprising:
   a command transfer control hierarchy comprising a plurality of control levels, including a first level comprising a master command transfer control, and including at least one additional lower level, each lower level having a plurality of command transfer controls configured serially, each command transfer control of a last level being associated with at least one of the clock domains, the command transfer control hierarchy being scalable, the master command transfer control and each command transfer control each having an equal number of input lines and output lines;
   a communication protocol for communicating commands among the control levels; and
   wherein command activation signals are immediately propagated serially from the first level to lower levels, and serially across command transfer controls in each level; and wherein command deactivation signals are communicated serially among and across control levels upon receipt of feedback from all lower levels that a commanded operation has been completed.

2. The system of claim 1, wherein the communication protocol comprises a global synchronization signal.

3. The system of claim 1, comprising an LBIST system.

4. The system of claim 3, wherein the command transfer control hierarchy controls the LBIST system such that LBIST testing is performed on the clock domains synchronously.

5. The system of claim 3, comprising a plurality of integrated circuit chips, wherein the command transfer control hierarchy controls the LBIST system such that LBIST testing is performed on the clock domains and across the chips synchronously.

6. A method for testing integrated circuitry comprising a plurality of clock domains and at least one integrated circuit chip, comprising:
   providing a command transfer control hierarchy comprising a plurality of control levels, including a first level comprising a master command transfer control, and including at least one additional lower level, each lower level having a plurality of command transfer controls configured serially, each command transfer control of a last level being associated with at least one of the clock domains, the command transfer control hierarchy being scalable, the master command transfer control and each command transfer control each having an equal number of input lines and output lines;

providing a communication protocol for communicating commands among the control levels; and wherein command activation signals are immediately propagated serially from the first level to lower levels, and serially across command transfer controls in each level; and wherein command deactivation signals are communicated serially among and across control levels upon receipt of feedback from all lower levels that a commanded operation has been completed.

7. The method of claim 6, wherein the communication protocol comprises a global synchronization signal.

8. The method of claim 6, comprising an LBIST system.

9. The method of claim 8, wherein the command transfer control hierarchy controls the LBIST system such that LBIST testing is performed on the clock domains synchronously.

10. The method of claim 8, comprising a plurality of integrated circuit chips, wherein the command transfer control hierarchy controls the LBIST system such that LBIST testing is performed on the clock domains and across the chips synchronously.

11. An article of manufacture, comprising:

at least one computer usable medium having computer readable program code means embodied therein for effecting testing of integrated circuitry comprising a plurality of clock domains and at least one integrated circuit chip, the computer readable program code means in the article of manufacture comprising:

computer readable code means for providing a command transfer control hierarchy comprising a plurality of control levels, including a first level comprising a master command transfer control, and including at least one additional lower level, each lower level having a plurality of command transfer controls configured serially, each command transfer control of a last level being associated with at least one of the clock domains, the command transfer control hierarchy being scalable, the master command transfer control and each command transfer control each having an equal number of input lines and output lines;

computer readable code means for providing a communication protocol for communicating commands among the control levels; and wherein command activation signals are immediately propagated serially from the first level to lower levels, and serially across command transfer controls in each level; and wherein command deactivation signals are communicated serially among and across control levels upon receipt of feedback from all lower levels that a commanded operation has been completed.

12. The article of manufacture of claim 11, wherein the communication protocol comprises a global synchronization signal.

13. The article of manufacture of claim 11, wherein the testing comprises LBIST.

14. The article of manufacture of claim 13, wherein the command transfer control hierarchy controls the LBIST testing such that testing is performed on all clock domains synchronously.

15. The article of manufacture of claim 13, comprising a plurality of integrated circuit chips, wherein the command transfer control hierarchy controls the LBIST testing such that testing is performed on the clock domains and across the chips synchronously.

16. At least one program storage device readable by a machine, tangibly embodying at least one program of instructions executable by the machine to perform a method for testing integrated circuitry comprising a plurality of clock domains, the method comprising:

providing a command transfer control hierarchy comprising a plurality of control levels, including a first level comprising a master command transfer control, and including at least one additional lower level, each lower level having a plurality of command transfer controls configured serially, each command transfer control of a last level being associated with at least one of the clock domains, the command transfer control hierarchy being scalable, the master command transfer control and each command transfer control each having an equal number of input lines and output lines;

providing a communication protocol for communicating commands among the control levels; and wherein command activation signals are immediately propagated serially from the first level to lower levels, and serially across command transfer controls in each level; and wherein command deactivation signals are communicated serially among and across control levels upon receipt of feedback from all lower levels that a commanded operation has been completed.

17. The program storage device of claim 16, wherein the communication protocol comprises a global synchronization signal.

18. The program storage device of claim 16, wherein the method comprises LBIST.

19. The program storage device of claim 18, wherein the command transfer control hierarchy controls the LBIST method such that LBIST testing is performed on the clock domains synchronously.

20. The program storage device of claim 18, comprising a plurality of integrated circuit chips, wherein the command transfer control hierarchy controls the LBIST method such that LBIST testing is performed on the clock domains and across the chips synchronously.

* * * * *